United States Patent [19]

Schweitzer, Jr.

[11] Patent Number: 5,406,195

[45] Date of Patent: Apr. 11, 1995

[54] PHASE-TO-PHASE VOLTAGE MONITOR FOR THREE-PHASE POWER DISTRIBUTION SYSTEM

[76] Inventor: Edmund O. Schweitzer, Jr., 2433 Center St., Northbrook, Ill. 60062

[21] Appl. No.: 994,625

[22] Filed: Dec. 21, 1992

[51] Int. Cl.$^6$ ............................................. G01R 1/04
[52] U.S. Cl. ..................... 324/96; 324/133; 310/303
[58] Field of Search ............... 324/133, 96, 106–107; 310/303

[56] References Cited

U.S. PATENT DOCUMENTS

| | | | |
|---|---|---|---|
| 3,614,610 | 10/1971 | Legatti | 324/115 |
| 3,660,757 | 5/1972 | Winslow | 324/122 |
| 3,667,039 | 5/1972 | Garfein et al. | 324/92 |
| 3,774,195 | 11/1973 | Schulthess et al. | 340/324 |
| 4,139,820 | 2/1979 | Rode | 324/133 |
| 4,152,639 | 5/1979 | Chaffee | 324/51 |
| 4,152,643 | 5/1979 | Schweitzer, Jr. | 324/120 |
| 4,259,634 | 3/1981 | Okamoto et al. | 324/74 |
| 4,301,407 | 11/1981 | Koslar | 324/96 |
| 4,458,198 | 7/1984 | Schwetizer, Jr. | 324/133 |
| 4,503,389 | 3/1985 | Singer | 324/133 |
| 4,550,288 | 10/1985 | Schwetizer, Jr. | 324/133 |
| 4,559,496 | 12/1985 | Harnden, Jr. et al. | 324/127 |
| 4,641,220 | 2/1987 | Schweitzer, Jr. | 361/187 |
| 4,714,916 | 12/1987 | Schweitzer, Jr. | 340/664 |
| 4,823,078 | 4/1989 | Mohebban | 324/133 |
| 5,012,182 | 4/1993 | Fujiki et al. | 324/96 |
| 5,237,233 | 8/1993 | Conley | 310/303 |

FOREIGN PATENT DOCUMENTS 1011161 12/1948 France .
1199016 7/1970 United Kingdom .

OTHER PUBLICATIONS

"Liquid Crystal Display", a publication of Hamlin Inc., Lake and Grove Streets, Lake Mills, Wis., circa Jun. 1, 1989.
"Electronically Scanned Analog Liquid Crystal Displays", by R. A. Soref, *Applied Optics*, Jun. 1970, vol. 9, No. 6.

Primary Examiner—Kenneth A. Wieder
Assistant Examiner—Barry C. Bowser
Attorney, Agent, or Firm—Lockwood, Alex, Fitzgibbon & Cummings

[57] ABSTRACT

A voltage monitoring device for a three-phase ungrounded delta-connected power system utilizes liquid crystal optical shutter devices capacitively coupled between phases of the system such that the combined light transparency of the optical shutter devices varies with system phase-to-phase voltage. A light source projects a light beam through the optical shutter devices to a light detector such that the output of the light detector is dependent on the system voltage. A control circuit responsive to the output of the light detector provides a control signal when the system voltage falls outside of a predetermined operating range.

22 Claims, 6 Drawing Sheets

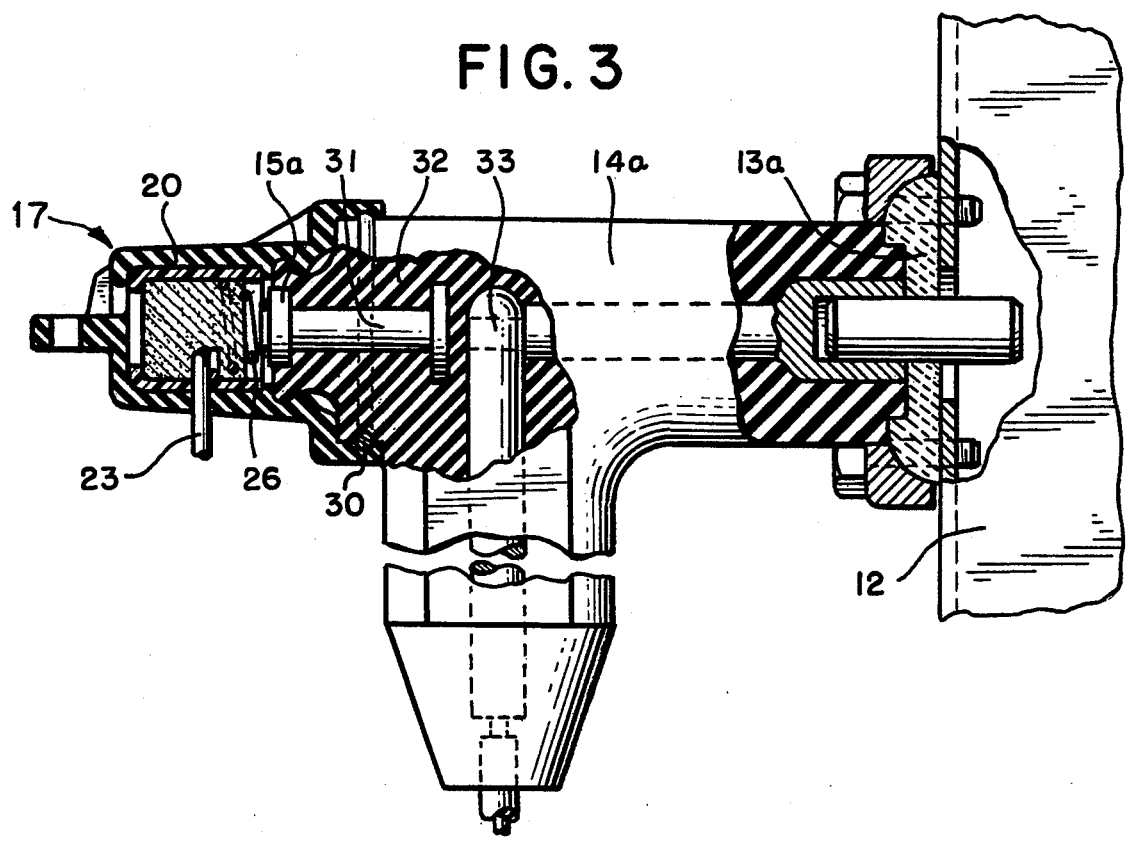
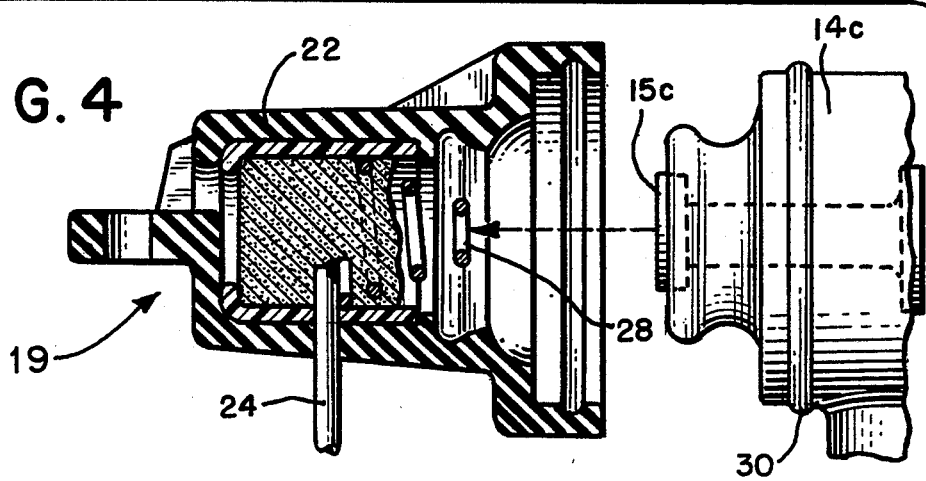
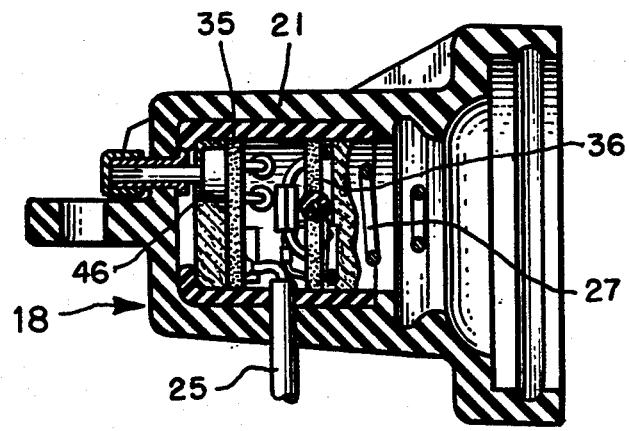

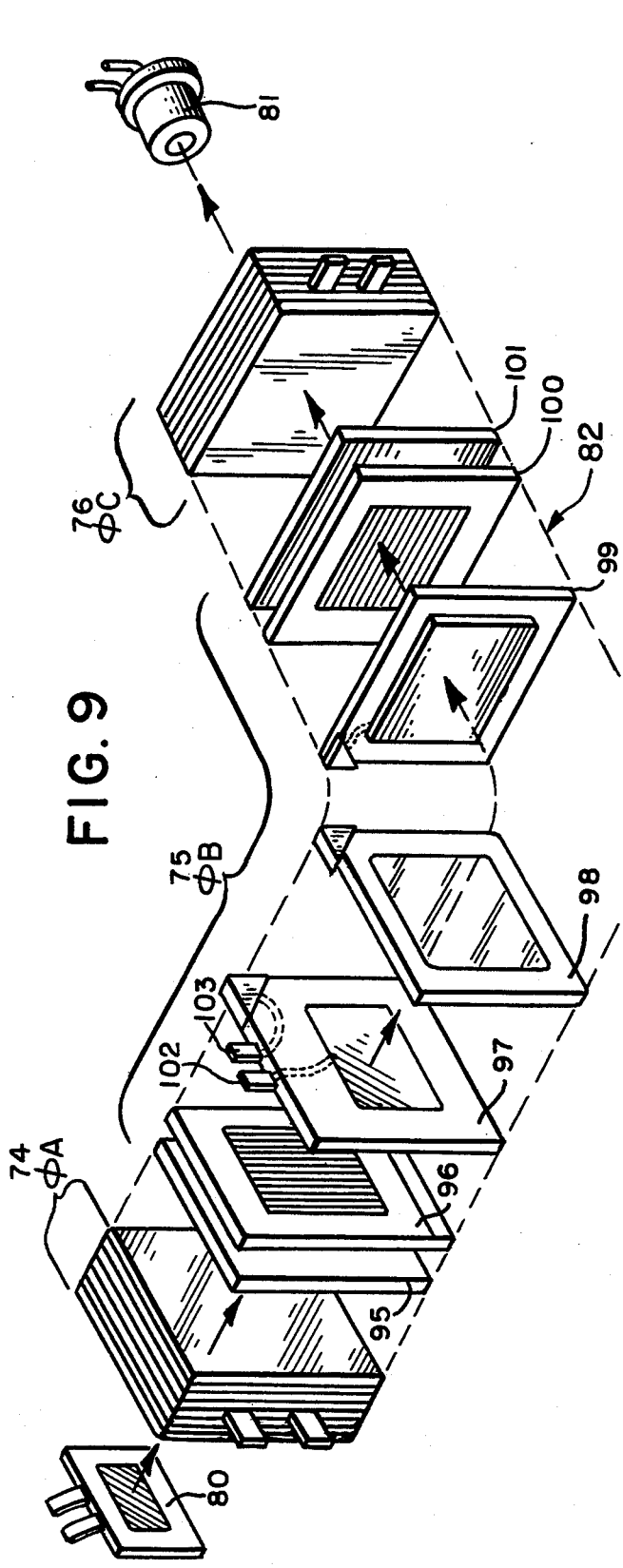
FIG. 9
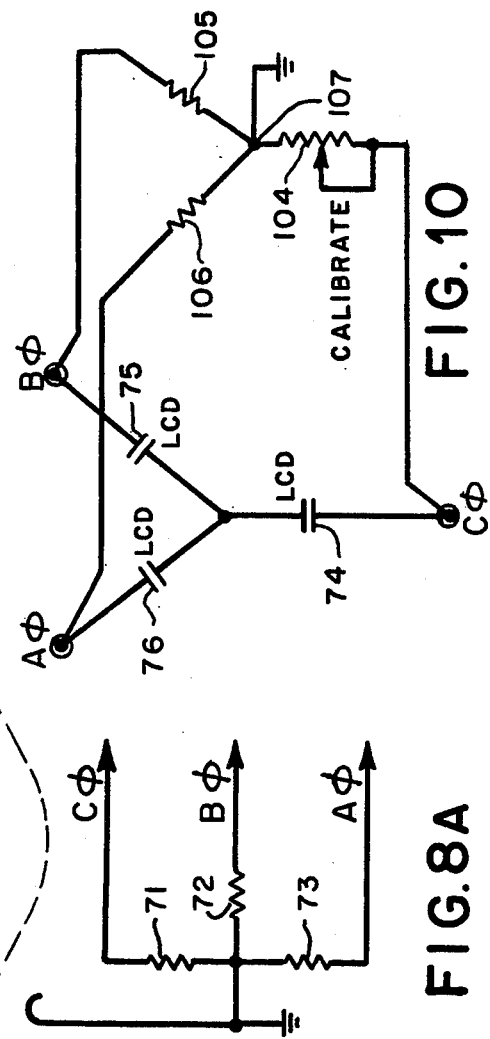
FIG. 10
FIG. 8A
FIG. 6A

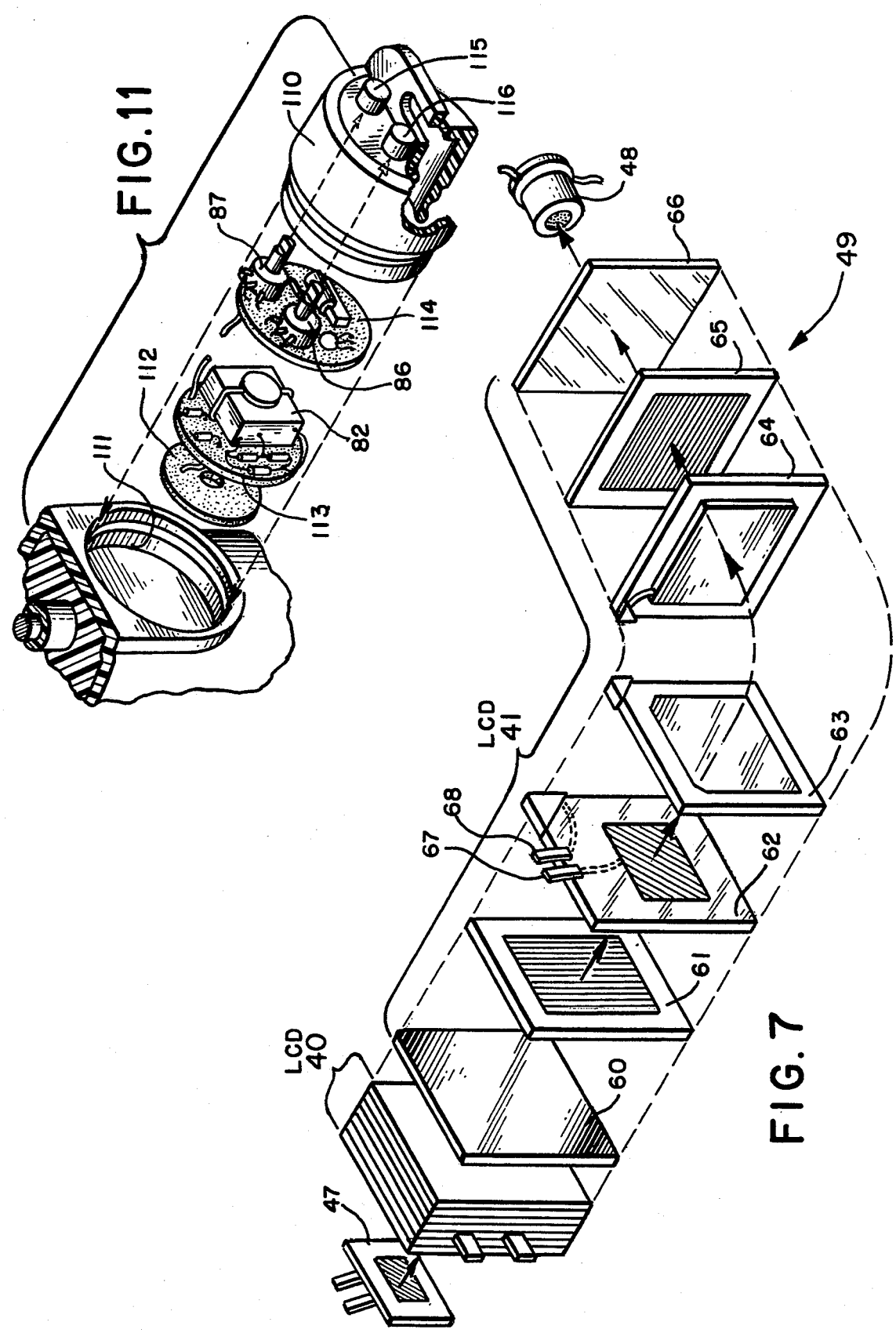

PHASE-TO-PHASE VOLTAGE MONITOR FOR THREE-PHASE POWER DISTRIBUTION SYSTEM

BACKGROUND OF THE INVENTION

In larger power distribution systems it is frequently necessary to switch ungrounded three-phase delta-connected systems. This is particularly true in systems feeding critical loads, where an alternate three-phase source may be switched to in the event of failure of a primary system.

Prior to switching to such an alternate source it is desirable to ascertain that the alternate source is at the correct voltage level. Because of the high operating voltages involved and the necessity of maintaining electrical isolation between the phases of the alternate source and ground, this has in the past been difficult and expensive to accomplish. Typically, individual potential transformers have been required in association with each phase, together with extensive monitoring equipment for analyzing the output of the transformers.

In contrast, the present invention provides a self-contained voltage monitor which may be installed over existing conventional test points associated with an ungrounded delta-connected three-phase system and does not require the use of potential transformers and associated monitoring circuitry. In the event of a low voltage condition, and, if desired, in the event of a high voltage condition, the monitor provides a control signal which can be utilized to sound an alarm, or to inhibit switching to the alternate source, either locally or at a remote location.

Thus, the present invention provides a voltage monitor particularly well suited for monitoring the phase-to-phase voltage of an ungrounded delta-connected power system of the type commonly used for supplying electrical power to large industrial loads.

Accordingly, it is a general object of the present invention to provide a new and improved voltage monitor for an ungrounded delta-connected three-phase electrical power system.

It is a more specific object of the present invention to provide a voltage monitor for an ungrounded three-phase power system wherein electrical isolation is maintained between the phases of the system and electrical ground.

It is a further object of the present invention to provide a three-phase voltage monitor which is reliable in operation and economical to construct and which may be conveniently installed on the conductors of an existing three-phase system.

SUMMARY OF THE INVENTION

A voltage monitor for monitoring the phase-to-phase voltage level of an electrical power system comprises at least a pair of high impedance optical shutter devices each having a pair of electrodes disposed in operative association with a layer of voltage-responsive light controlling material, first circuit means for capacitively coupling the electrodes of the high impedance optical shutter devices to the three-phase system whereby the transparency of the devices to light varies as a function of the phase-to-phase voltage level of the system, a light source adapted to direct a beam of light through the optical shutter devices, a light detector adapted to receive the beam of light after transmission through the optical shutter devices and to produce an output dependent on the amplitude of the light incident on the detector, and second circuit means responsive to the output of the light detector for producing a control signal upon the voltage falling outside a predetermined range.

The invention is further directed to a voltage monitor for monitoring the phase-to-phase voltage level of an ungrounded three phase delta-connected power system. The monitor includes first, second and third pickup elements capacitively coupled to respective phases of the system for producing respective first, second and third sensing signals indicative of the phase and voltage of the respective phases, first and second high impedance optical shutter devices each having at least a pair of electrodes disposed in operative association with a layer of voltage-responsive light controlling material, first circuit means for applying the first, second and third sensing signals to the electrodes of the high impedance optical shutter devices whereby the combined transparency of the devices to light varies as a function of the phase-to-phase voltage of the system, a light system adapted to direct a beam of light through the optical shutter devices, a light detector adapted to receive the beam of light after transmission through the optical shutter devices and to produce an output dependent on the amplitude thereof, and second circuit means responsive to the output of the light detector for producing a control signal upon the phase-to-phase voltage falling outside a predetermined range.

A voltage monitor for monitoring the phase-to-phase voltage level of an ungrounded three-phase delta-connected electrical power system comprises first, second and third pickup elements capacitively coupled to respective phases of the source for producing respective first, second and third sensing signals indicative of the phase and voltage of the respective phases, first, second and third high impedance optical shutter devices each having at least a pair of electrodes disposed in operative association with a layer of voltage-responsive light controlling material, first circuit means for applying such first, second and third sensing signals to the electrodes of the first, second and third high impedance optical shutter devices whereby the combined transparency of the devices to light varies as a function of the phase-to-phase voltage of the source, a light source adapted to direct a beam of light through the optical shutter device, a light detector adapted to receive the beam of light after transmission through the optical shutter devices and to produce an output dependent on the amplitude thereof, and second circuit means responsive to the output of the light detector for producing a control signal upon the phase-to-phase voltage falling outside of a predetermined range.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 3 is an enlarged side elevational view partially in section of the Aφ elbow connector of FIG. 2 showing the associated Aφ component of the three-phase voltage monitor installed thereon.

FIG. 4 is an enlarged side elevational view of the Cφ elbow connector of FIG. 2 showing the associated Cφ component of the three-phase voltage monitor installed thereon.

FIG. 5 is an enlarged cross-sectional view of the Bφ component of the three-phase voltage monitor showing representative placement of circuitry therein.

FIG. 6A is a schematic diagram illustrating in detail the interconnection between certain electrical elements shown in FIG. 6.

FIG. 7 is an enlarged partially-exploded perspective view of the two liquid crystal optical shutter devices utilized in the three-phase voltage monitor of FIGS. 1–6.

FIG. 8A is a schematic diagram of additional circuitry which may be optionally included in the alternate embodiment of FIG. 8 to render the voltage monitor responsive to an imbalance to ground among the three phases of a monitored system.

FIG. 9 is an enlarged partially-exploded perspective view of the three liquid crystal optical shutter devices utilized in the alternate embodiment of FIG. 8.

FIG. 10 is a schematic diagram illustrating an alternate circuit for connecting the liquid crystal optical shutter devices of the voltage monitor of FIGS. 8–10 which provides increased monitor sensitivity for use with lower voltage sources.

FIG. 11 is an exploded perspective view of the Bφ component of the voltage monitor of FIGS. 8 and 9.

DESCRIPTION OF THE PREFERRED EMBODIMENT

Figure 1:
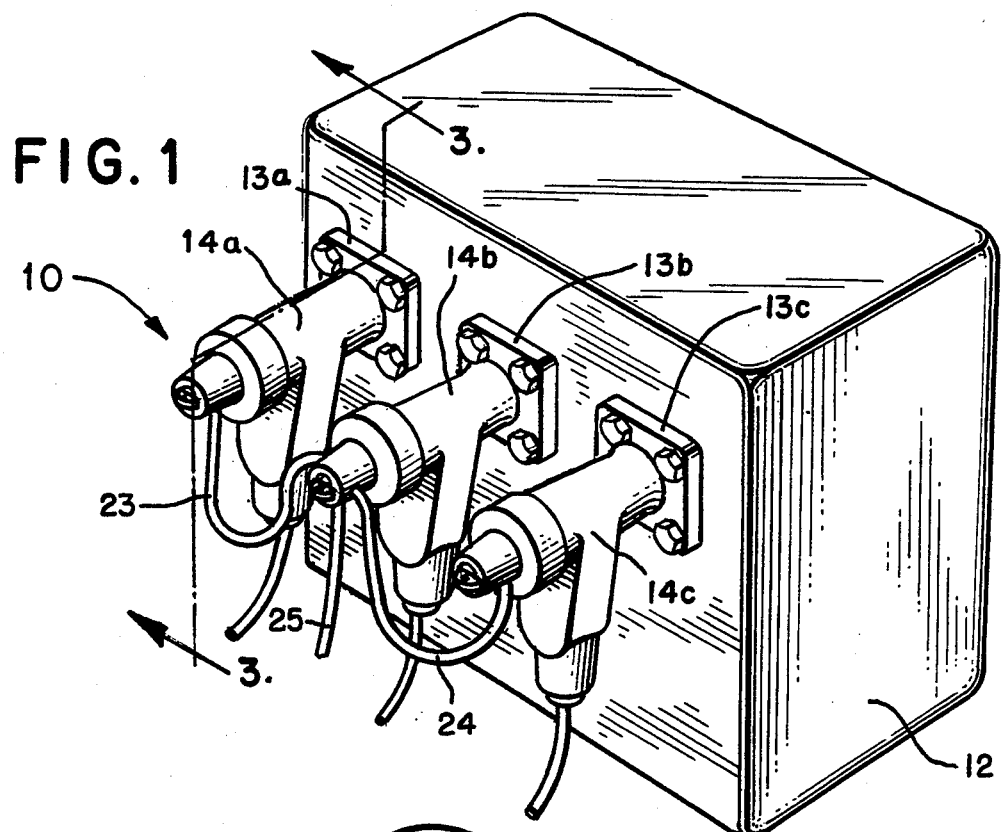
FIG. 1 is a perspective view of a portion of an ungrounded delta-connected three-phase electrical power system showing the installation thereon of a three-phase voltage monitor constructed in accordance with the invention.

Referring to the Figures, and particularly to FIGS. 1–5, a three-phase voltage monitor 10 constructed in accordance with the invention is shown in association with an ungrounded three-phase delta-connected electrical power distribution system including a transformer 12, which, in accordance with conventional practice, includes terminals 13a–13c corresponding to the three phases (Aφ, Bφ and Cφ) of the three phase system. In this instance, the three terminals 13a–13c are each fitted with conventional elbow connectors 14a–14c of conventional design for the purpose of connecting the terminals to conductors in the system. The elbow connectors 14a–14c include integral test points 15a–15c (FIG. 2) which provide a capacitive coupling to the internal conductors within the connector to enable various monitoring devices to be operated in association with each elbow connector. Examples of such monitoring devices include fault indicators of the type manufactured by E. O. Schweitzer Manufacturing Company and illustrated, for example, in U.S. Pat. Nos. 5,070,301, 4,794,332 and 4,686,518, or voltage monitoring devices such as illustrated in, for sample, U.S. Pat. Nos. 5,095,265 and 4,714,916.

As shown in FIGS. 1–5, monitoring device 10 comprises an Aφ component 16, a Bφ component 17, and a Cφ component 18. The three components 16–18 are enclosed within cylindrical housings 20–22, respectively, each formed of a resilient rubber material including an electrically conductive surface layer formed by an EPDM conductive rubber coating, or the like, and constructed for removable snap-fit engagement with test points 15a–15c of elbow connectors 14a–14c, respectively. When engaged to the elbow connector, the electrically conductive outer layers of the housings electrically communicate with similar electrically conductive outer layers on the elbow connectors to provide a safety ground.

The Aφ component 16 is connected to the Bφ component 17 by a flexible insulated electrical conductor 23, and the Cφ component 18 is similarly connected to the Bφ component 17 by a second flexible insulated conductor 24. Conductors 23 and 24, in accordance with conventional practice, include an electrically conductive outer sheath in electrical communication witch the electrically grounded component housings to provide a softing ground. A flexible multi-conductor cable 25 associated with the Bφ component 17 provides an electrical connection to an associated alarm or control unit (not shown) with which the voltage monitoring device may be associated.

Figure 2:
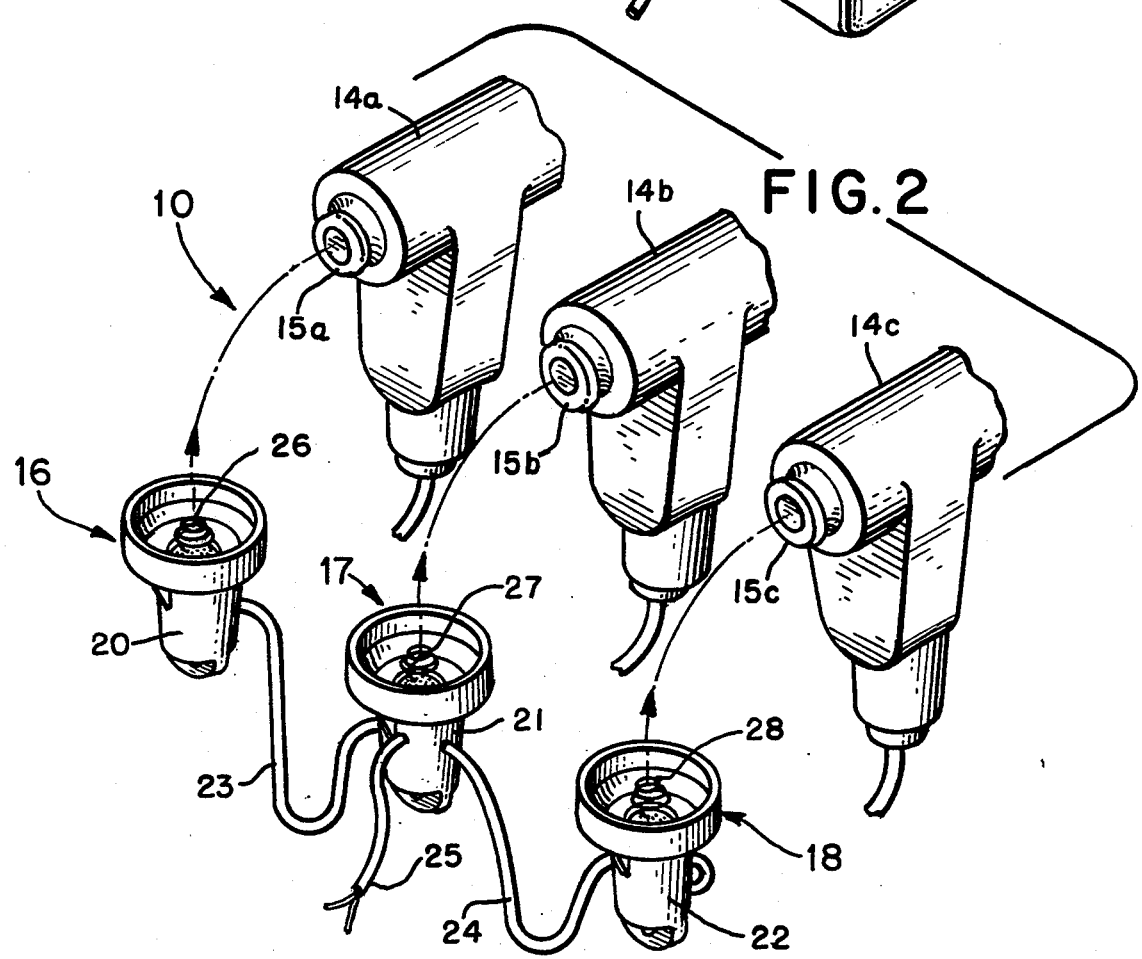
FIG. 2 is an exploded perspective view illustrating the installation of the three-phase voltage monitor on conventional Aφ, Bφ and Cφ elbow connectors utilized in conjunction with the power system of FIG. 1.

As illustrated in FIG. 2, the three monitor components 16–18 can be readily removed from elbow connectors 14a–14c by engaging eyelets integrally formed on housings 20–22 by conventional means such as a lineman's hotstick (not shown). FIG. 3 depicts the Aφ component housing 20 installed on elbow connector 14a. When so installed the component housing engages a lip 30 around the test point such that the housing is held firmly in place. Thus positioned, a spring contact member, such as a helical spring contact member 26 within the component is brought to bear against the test point, which is seen to include an imbedded electrode 31 extending into the body 32 of the elbow connector a sufficient distance to establish a capacitive coupling with the conductor 33 within the connector.

Referring to FIG. 4, the Cφ component 22, which may be identical to Aφ component housing 20, is shown removed from elbow connector 14c. A metallic helical spring contact 28 is disposed within housing 22 such that when the housing is mounted on the elbow connector the spring contact is brought into contact with test point 15c.

Referring to FIG. 5, the Bφ component 21 of voltage monitor 10 includes a contact member in the form of a metallic helical spring 27 for establishing electrical contact with test point 15b of elbow connector 14b when the component is installed on the connector. In addition, the component housing defines an interior chamber within which the circuit boards and various circuit components of the monitor are contained.

Figure 6:
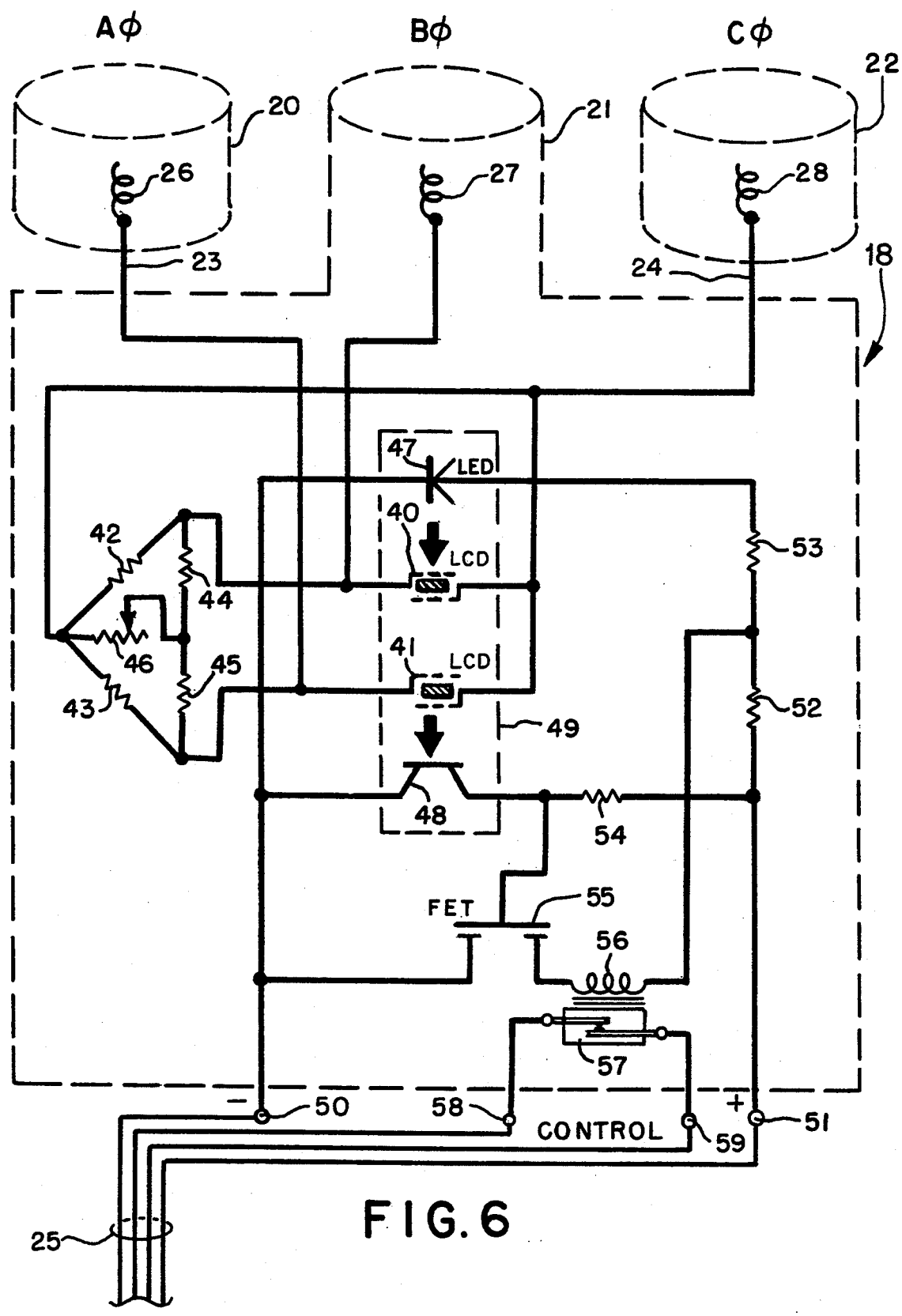
FIG. 6 is a schematic diagram of the three-phase voltage monitor of FIGS. 1–5.

Referring to FIG. 6, in operation the metallic spring contacts 26–28 develop sensing signals representative of the voltage level and phase existing on the three phases of the monitored power source. In accordance with the invention, the sensing signal developed on spring contact 26 of component 20 is applied through conductor 23 to one electrode of a first liquid crystal display (LCD) optical shutter 40. Similarly, the spring contact 27 of component 21 is applied through cable 24 to one contact of a second LCD optical shutter 41. The remaining contacts of LCD 40 and LCD 41 are connected to spring contact 28 of component 22 through conductor 24. Contact 28 is also connected through a resistor 42 to contact 27, and through a resistor 43 to contact 26. A pair of serially connected resistors 44 and 45 are connected between contacts 27 and 26, and the juncture of the resistor pair is connected through a potentiometer 46 to contact 28.

Thus connected, the two liquid crystal devices 40 and 41 have a net transparency to light which accurately reflects the phase-to-phase voltage level in the monitored three-phase delta-connected system. As best illustrated in FIG. 6A, the particular interconnection of resistors 42–45 and potentiometer 46 provides that all three phase-to-phase voltages (A–B, B–C, C–A) of the system appear across the two LCD optical shutter devices. LCD 40 attenuates light as a function of the B$\phi$–C$\phi$ voltage, LCD 41 alternates light as a function of the A$\phi$–C$\phi$ voltage, and the two LCDs each attenuate light as a half function of the A$\phi$–B$\phi$ voltage, since the two LCDs are effectively connected in series relative to this voltage.

The purpose of potentiometer 46 is to enable the portion of the sensed phase-to-phase voltages applied to the LCD optical shutters to be adjusted such that the LCDs operate in the middle of their operating range. In this regard, potentiometer 46 may also function as a calibration control to establish the voltage level at which the voltage monitor 10 will produce a control or alarm output to associated circuitry.

In accordance with the invention, a light emitting diode (LED) 47 is provided within housing 21 to generate a light beam which projects through optical shutter devices 40 and 41. After passing through the two devices the beam is received by a Darlington phototransistor 48, which provides an impedance change with changes in the amplitude of incident light. The two LCD optical shutters 40 and 41, LED 47 and phototransistor 48 may be arranged in a compact assembly 49 which provides electrical isolation between the sensing circuits associated with the LCD devices and the monitored three-phase source and the control circuitry associated with the phototransistor 48.

Power is supplied to voltage monitor 10 by way of contacts 50 and 51, which may be contained in housing 20 and connected through cable 25 to a remote DC source. LED 47 is powered from this source through resistors 52 and 53, and phototransistor 48 is connected to the source through a resistor 54. A threshold level for actuation of the alarm circuit is established by a field effect transistor 55.

As the phase-to-phase voltage level of the source increases from zero to a user-designated minimum operating level and the light incident on photo transistor 48 decreases, the impedance of the phototransistor increases, causing an increased voltage at the gate of FET 55. Eventually, as the system voltage reaches its minimum level, the threshold of the FET is reached and relay 56 is energized. Thus, the relay is actuated only when the system voltage is above the threshold, and not when the voltage falls below the threshold. The relay contacts 57 in turn provide a control effect at terminals 58 and 59 for actuation, through conductors in cable 25, of a remote alarm or other switching function.

With actuation of relay 56 the voltage drop across resistor 52 increases, causing LED 47 to produce less light. This in turn causes the impedance of photo transistor 48 to increase and thus provide a latching function which helps to maintain relay 56 energized.

Relay 56 continues to be energized until the phase-to-phase voltage of the source decreases, at which time the light incident on photodetector 48 increases and the impedance of the photodetector decreases to a level where FET 55 is no longer conductive. At this time relay 56 is de-energized, contacts 57 open and the control effect is no longer present on terminals 58 and 59.

As best shown in FIG. 5, the components of the voltage monitor are preferably mounted on circuit boards 35 and 36 within the B$\phi$ housing. Potentiometer 46 preferably extends through the front on the housing and may be provided with a removable cap for access by the user. Terminals 50, 51, 58 and 59 may be accessed through individual conductors within cable 25. In practice, cable 25 may be of sufficient length to extend to a control or junction box (not shown) wherein a power supply suitable for operating relay 56, LED 47 and FET 55 may be provided.

Referring to FIG. 7, the LCD optical shutter devices 40 and 41 may be conventional and identical in construction and operation. LCD 41, for example, may comprise a transparent front face plate 60, a front polarizer 61, a transparent front display electrode 62, a nematic liquid crystal layer 63, a transparent rear display electrode 64, a rear polarizer 65 aligned at right angles to polarizer 61, and a transparent rear face plate 66.

In operation, light entering LCD 41 through face plate 60 passes through polarizer 61, which, in the illustrated embodiment, provides a vertical polarization. The polarized light then passes through electrode 62 to nematic liquid crystal layer 63, wherein, in the absence of an applied electric field, it is rotated 90°. The rotated light, now horizontally polarized, passes through electrode 64, polarizer 65 and face plate 66 to photo transistor 48. When an increasing electric field is applied to layer 63 by applying a voltage to electrodes 62 and 64 at terminals 67 and 68, nematic layer 63 increasingly rotates the polarized light beyond 90°. Consequently, the light passing through the layer is increasingly unable to pass through polarizer 65 and the transmission of light through the LCD 41 decreases.

LCD 40, which may be identical to LCD 41 in structure and function, is rotated 90° with respect to LCD 41 such that the rear polarizer of the LCD, and consequently the rotated light passing through the rear face plate of the LCD, are complimentarily vertically polarized to the front polarizer 61 of LCD 40.

The necessary signals for actuating LCD optical shutters 40 and 41 are provided by first circuit means which include capacitive pickup electrodes 26–28 associated with the A, B and C phases of the monitored system. Resistors 42–45 and potentiometer 46 are selected such that the LCD optical shutters operate near the middle of their voltage range to provide a transition between transparent and opaque conditions with changes in applied voltage.

The optical transparency of the LCD optical shutters increases with decreasing phase-to-phase voltage, and the impedance of photodetector 48 decreases with increased incident light. As the phase-to-phase voltage of the system increases and reaches the minimum operating voltage, the voltage developed across the resistor, and hence the gate voltage on FET 55, exceeds the threshold of the FET, conditioning the FET into conduction and actuating relay 56. By adjusting potentiometer 46 the point at which relay 56 is actuated is made to correspond to the desired minimum phase-to-phase voltage level.

Figure 8:
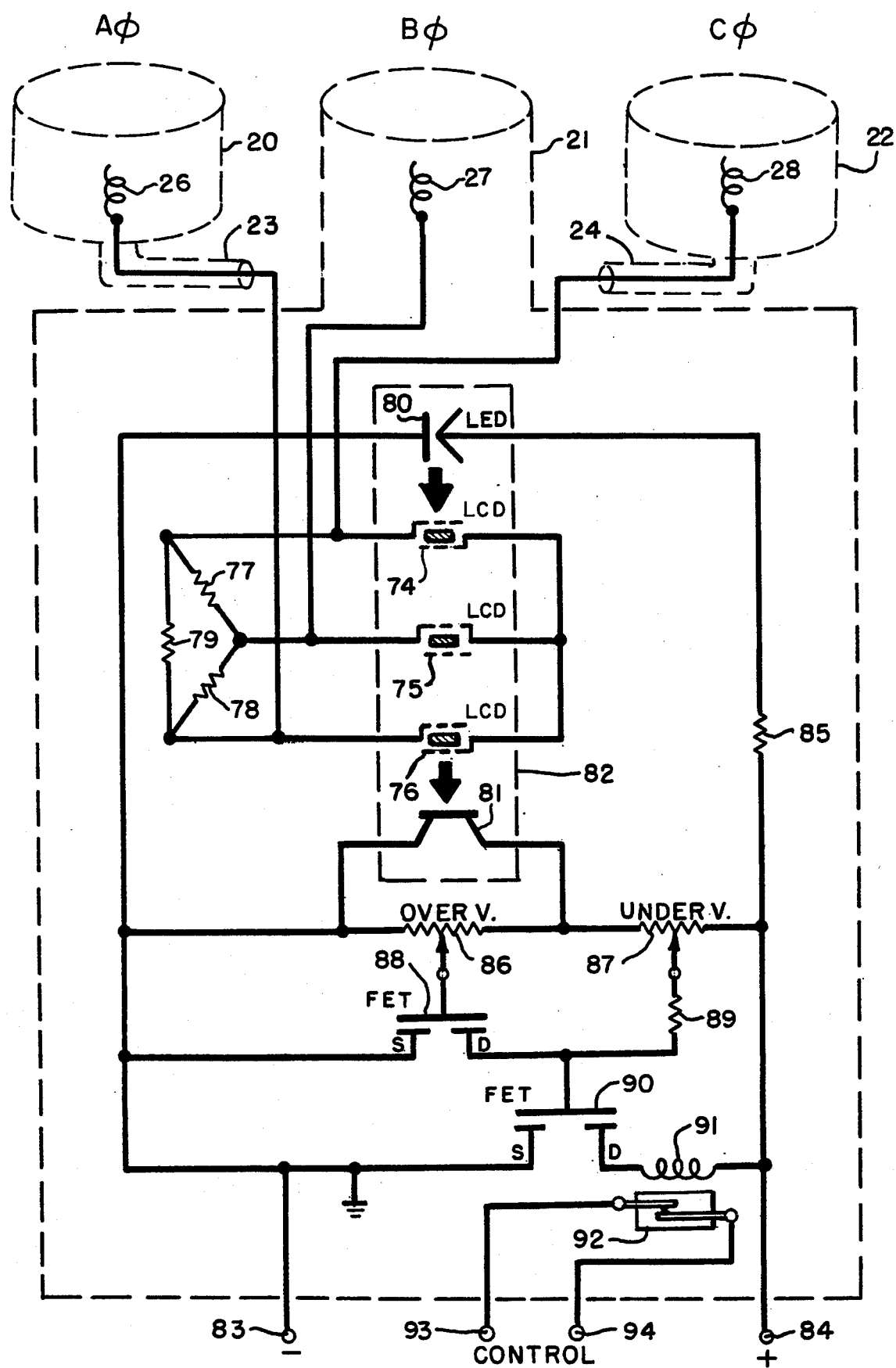
FIG. 8 is a schematic diagram of an alternate embodiment of the three-phase voltage monitor utilizing three liquid crystal optical shutter devices.

Referring to FIG. 8, in an alternate embodiment of the invention three optical shutter devices in the form of LCDs 74-76 are provided in combination with an LED 80 and a phototransistor 81 in an assembly 82. One electrode of each LCD is connected to a respective one of the three capacitive coupling elements 26-28 associated with the Aφ, Bφ and Cφ of the monitored system. The remaining electrodes are connected together such that each LCD optical shutter sees one of the system phase-to-phase voltages A-B, B-C and C-A. Three resistors 77-79 act as voltage dividers in conjunction wit the high impedance capacitive pickup elements such that the voltages applied to the LCD optical shutters fall within the middle of the operating ranges of the devices.

As in the previously described embodiment, the shutter-controlled light from LED 80 activates photo-transistor 81 to produce an impedance change in the device as an inverse function of light intensity. Current supplied by an external power supply, typically, for example, a 24 VDC supply connected through cable 25 to terminals 83 and 84, produces a voltage drop across over-voltage potentiometer 86 and under-voltage potentiometer 87. The voltage from the arm of potentiometer 87 is applied to FET 90 through resistor 89 and switches FET 90 into conduction when the threshold of the FET, typically in the order of 3 volts, is exceeded.

Since the optical transparency of optical shutters 74-76 decreases with increasing phase-to-phase voltage, increasing phase-to-phase voltage increases the impedance of photodetector 81. Eventually, when system voltage reaches a user-designated maximum level, the threshold voltage of FET 90 is exceeded, the FET becomes conductive, and relay 91 is actuated. A further increase in phase-to-phase voltage to a user-designated maximum operating level causes the threshold of FET 88 to be exceeded, rendering that device conductive to ground the gate of FET 90. This renders FET 90 non-conductive, deenergizes relay 91 and opens switch contacts 92. Thus, relay 91 is actuated only when system voltage is above the minimum level and below the maximum level, and is not actuated for over or under voltage conditions.

By selecting resistors 77-79 the LCD optical shutters 74-76 are operated mid-range for a given delta-connection operating voltage. Potentiometer 86 is adjusted to close relay contacts 92 upon the source exceeding a minimum under-voltage level. Potentiometer 86 is adjusted to open the relay contacts upon the voltage of the monitored system reaching a predetermined over-voltage level. Thus, relay 91 is energized only when the phase-to-phase voltage level of the monitored source is within an acceptable range.

Where it is desired that the monitor respond to an imbalance between the phases with respect to electrical ground, as where one of the phases is partially shorted to ground, additional resistors 71-73 may be connected in a Y-configuration between the three-phase capacitive pick-up electrodes and electrical ground, as shown in FIG. 8A.

Referring to FIG. 9, optical shutter assembly 82 may be similar in construction to optical shutter assembly 49, except that it comprises three individual LCD optical shutter devices. As previously described, each LCD device may be conventional in construction and operation. LCD 75 may comprise, for example, a front face plate, a front polarizer 96, a transparent front electrode 97, or nematic liquid crystal layer 98, a transparent rear electrode 99, a rear polarizer 100 and a rear face plate 101. Contacts 102 and 103 provide for the application of actuating voltage to display electrodes 97 and 99. Furthermore, LCD 74 and LCD 76 are arranged at right angles to LCD 75 for compatible polarization.

When lower phase-to-phase source voltages exist, the sensitivity of the monitor can be increased by utilizing the alternate circuit shown in FIG. 10 for actuating the three LCD optical shutters 74-76 of the embodiment of FIG. 8. In particular, the three Wye-connected resistors 104, 105 and 106 are provided in place of the delta-connected resistors 78-79 in FIG. 8. This arrangement, wherein the common point 107 of the Wye is electrically grounded, produces a better impedance match between the LCDs and the test points, which typically provide a 5 picofarad capacitive coupling to the line. Consequently, a greater portion of the phase-to-phase voltage appears across the LCD optical shutters and the monitor is operable at lower voltage levels. Resistor 104, or either of resistors 105 or 106, may be a potentiometer to enable the voltage level applied to the LCD optical shutter devices to be adjusted to the mid-range of the devices.

Referring to FIG. 11, the electrical components of the monitor may be contained within the housing 110 of the Bφ component. In this case, the housing is adapted for mounting within a non-metallic test point 111 of the type described in U.S. Pat. No. 4,904,932, and the metallic spring contact of the previously described embodiments is replaced by an internal metallic coupling plate 112. The light shutter assembly 82 is mounted on a rear circuit board 113 and potentiometers 86 and 87 are mounted on a front circuit board 114 for access from the front of the component. A pair of user-removable caps 115 and 116 may be provided to protect the potentiometers.

It will be appreciated that while the optical shutters of the illustrated ,embodiments have been shown as LCD's, it is possible to use other high impedance devices, such as Kerr cells, wherein a dielectric under electrostatic stress becomes doubly refracting so as to convert plane polarized light to elliptical polarization. Moreover, while the system has been shown as contained within three housings adapted for snap-fit mounting on the metallic test points of three elbow connectors, the invention may also be utilized on non-metallic test points by incorporating a capacitive pick-up plate within the housings.

Furthermore, where it is desired to sense both a high and low condition in the two LCD optical shutter embodiment of FIGS. 6-7, the threshold circuitry shown in the three LCD optical shutter embodiment of FIG. 8, i.e., photodetector 81, potentiometers 86 and 87, FET transistors 88 and 90, resistor 89, and relay 91, can be substituted for photodetector 48 and its associated circuitry in FIG. 6.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A voltage monitor for monitoring the voltage level of a three-phase electrical power system, comprising:
   first and second high impedance optical shutter devices each having first and second control electrodes disposed in operative association with a layer of voltage-responsive light controlling material;

first circuit means for capacitively coupling said first and second control electrodes of said first high impedance optical shutter device to the first and second phases of the three-phase power source, respectively, and for capacitively coupling said first and second control electrodes of said second high impedance optical shutter device to the first and third phases of the three-phase power source, respectively, and for coupling said second control electrodes of said shutter devices through respective impedances to said first phase, whereby the transparency of said shutter devices to light varies as a function of the phase-to-phase voltage level of the three-phase power system;

a light source adapted to direct a beam of light through said optical shutter devices;

a light detector adapted to receive said beam of light after transmission through said optical shutter devices and to produce an output dependent on the amplitude thereof; and second circuit means responsive to the output of said light detector for producing a control signal upon said phase-to-phase voltage of said three phase system falling outside of a predetermined range.

2. A voltage monitor as defined in claim 1 wherein said first circuit means form a non-ohmic capacitive coupling to the three-phase power system.

3. A voltage monitor as defined in claim 1 wherein said optical shutter device comprises a liquid crystal device.

4. A voltage monitor as defined in claim 3 wherein said light source comprises a light emitting diode.

5. A voltage monitor as defined in claim 4 wherein said light detector comprises a photo transistor.

6. A voltage monitor as defined in claim 1 wherein said second circuit means comprise a first field effect transistor having a threshold corresponding to a minimum acceptable phase-to-phase system voltage level.

7. A voltage monitor as defined in claim 6 wherein said second circuit means comprise a second field effect transistor having a threshold corresponding to a maximum acceptable phase-to-phase system voltage level.

8. A voltage monitor for monitoring the phase-to-phase voltage level of a three-phase electrical power system, comprising:

first, second and third pickup elements capacitively coupled to respective first, second and third phases of the three-phase power system for producing first, second and third sensing signals indicative of the phase and voltage of said first, second and third phases, respectively;

first and second high impedance optical shutter devices each having at least a pair of control electrodes disposed in operative association with a layer of voltage-responsive light controlling material;

first circuit means for applying said first, second and third sensing signals to said control electrodes of said high impedance optical shutter devices whereby the combined transparency of said devices to light varies as a function of the phase-to-phase voltage of the three-phase power source;

a light source adapted to direct a beam of light through said optical shutter devices;

a light detector adapted to receive said beam of light after transmission through said optical shutter devices and to produce an output dependent on the amplitude thereof; and second circuit means responsive to the output of said light detector for producing a control signal upon said phase-to-phase voltage falling outside of a predetermined range.

9. A voltage monitor as defined in claim 8 wherein said optical shutter device comprises a liquid crystal display device.

10. A voltage monitor as defined in claim 9 wherein said light source a light emitting diode.

11. A voltage monitor as defined in claim 10 wherein said light detector comprises a phototransistor.

12. A voltage monitor as defined in claim 8 wherein said second circuit means comprise a first field effect transistor having a threshold corresponding to a minimum acceptable phase-to-phase system voltage level.

13. A voltage monitor as defined in claim 12 wherein said second circuit means comprise a second field effect transistor having a threshold corresponding to a maximum acceptable phase-to-phase system voltage level.

14. A voltage monitor as defined in claim 8 wherein said first circuit means include impedance means for applying a predetermined portion of said first sensing signal to said first optical shutter device, a predetermined portion of said second sensing signal to said second optical shutter device, and equal portions of said third sensing signal to said first and second optical shutter devices.

15. A voltage monitor for monitoring the phase-to-phase voltage level of a three-phase electrical power system, comprising:

first, second and third pickup elements capacitively coupled to respective first, second and third phases of the three-phase power source for producing first, second and third sensing signals indicative of the phase and voltage of said first, second and third phases, respectively;

first, second and third high impedance optical shutter devices each having a pair of control electrodes disposed in operative association with a layer of voltage-responsive light controlling material;

first circuit means for applying said first, second and third sensing signals to said control electrodes of said first, second and third high impedance optical shutter devices whereby the combined transparency of said devices to light varies as a function of the phase-to-phase voltage of the system;

a light source adapted to direct a beam of light through said optical shutter devices;

a light detector adapted to receive said beam of light after transmission through said optical shutter devices and to produce an output dependent on the amplitude thereof; and second circuit means responsive to the output of said light detector for producing a control signal upon said phase-to-phase voltage falling outside of a predetermined range.

16. A voltage monitor as defined in claim 15 wherein said optical shutter device comprises a liquid crystal display device.

17. A voltage monitor as defined in claim 16 wherein said light source comprises a light emitting diode.

18. A voltage monitor as defined in claim 17 wherein said light detector comprises a phototransistor.

19. A voltage monitor as defined in claim 15 wherein said second circuit means comprise a first field effect transistor having a threshold corresponding to a minimum acceptable phase-to-phase system voltage level.

20. A voltage monitor as defined in claim 19 wherein said second circuit means comprise a second field effect transistor having a threshold corresponding to a maximum acceptable phase-to-phase system voltage level.

21. A voltage monitor as defined in claim 15 wherein said first circuit means couple one control electrode of each of said first, second and third optical shutter devices to a respective one of said first, second and third pick-up elements, and couple the remaining control electrode of said shutter devices to each other.

22. A voltage monitor as defined in claim 21 wherein said first circuit means further comprise first, second and third impedance elements connected to respective ones of said pick-up elements in a Wye configuration.

* * * * *